(12) United States Patent
Tabata et al.

(10) Patent No.: US 12,191,629 B2
(45) Date of Patent: Jan. 7, 2025

(54) LASER MODULE AND METHOD OF MANUFACTURING THE SAME

(71) Applicant: FUJIKURA LTD., Tokyo (JP)

(72) Inventors: Yoshihiro Tabata, Chiba (JP); Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 662 days.

(21) Appl. No.: 17/601,615

(22) PCT Filed: Mar. 16, 2020

(86) PCT No.: PCT/JP2020/011339
§ 371 (c)(1),
(2) Date: Oct. 5, 2021

(87) PCT Pub. No.: WO2020/209008
PCT Pub. Date: Oct. 15, 2020

(65) Prior Publication Data
US 2022/0181842 A1    Jun. 9, 2022

(30) Foreign Application Priority Data

Apr. 12, 2019 (JP) .................................. 2019-076597

(51) Int. Cl.
*H01S 5/0239* (2021.01)
*H01S 5/02251* (2021.01)

(52) U.S. Cl.
CPC ........ *H01S 5/0239* (2021.01); *H01S 5/02251* (2021.01)

(58) Field of Classification Search
CPC ............. H01S 5/02208; H01S 5/02216; H01S 5/02345; H01L 2924/12042
See application file for complete search history.

(56) References Cited

U.S. PATENT DOCUMENTS

| 3,943,623 | A | * | 3/1976 | Mizutani | ............... | H01L 23/057 |
| | | | | | | 174/556 |
| 4,044,374 | A | * | 8/1977 | Roberts | ................... | H01J 29/92 |
| | | | | | | 257/695 |

(Continued)

FOREIGN PATENT DOCUMENTS

| CN | 1435927 A | 8/2003 |
| CN | 103843164 A | 6/2014 |

(Continued)

OTHER PUBLICATIONS

Extended European Search Report issued in corresponding European Patent Application No. EP 20788586.4 dated Dec. 15, 2022 (13 pages).

*Primary Examiner* — Joshua King
(74) *Attorney, Agent, or Firm* — Osha Bergman Watanabe & Burton LLP

(57) ABSTRACT

A laser module includes an optical fiber, a laser device, an optical system, a housing, a lead terminal, a conductive wire, and an insulation member. The laser device emits a laser beam. The optical system couples the laser beam, emitted from the laser device, to the optical fiber. The housing includes a base plate on which the laser device is fixed and a side wall that includes an opening. The lead terminal extends from an outside of the housing through the opening of the side wall into the housing. The conductive wire electrically connects a connecting portion of the lead terminal, located within the housing, to the laser device. The insulation member includes a seal portion and an extension portion.

8 Claims, 3 Drawing Sheets

(56) References Cited

U.S. PATENT DOCUMENTS

| | | | |
|---|---|---|---|
| 5,195,102 A | 3/1993 | McLean et al. | |
| 7,039,083 B2* | 5/2006 | Carroll | H01S 5/042 372/36 |
| 10,512,155 B2* | 12/2019 | Kitamura | H01S 5/02345 |
| 10,948,671 B2* | 3/2021 | Lin | H04J 14/0256 |
| 11,309,680 B2* | 4/2022 | Matsuo | H01S 5/02315 |
| 2002/0070045 A1* | 6/2002 | Musk | H01L 23/16 174/650 |
| 2003/0147436 A1 | 8/2003 | Yagi et al. | |
| 2004/0074661 A1* | 4/2004 | Schiaffino | H01S 5/02212 257/E23.19 |
| 2004/0179562 A1* | 9/2004 | Carroll | H01S 5/042 372/36 |
| 2007/0228535 A1* | 10/2007 | Fujino | H01S 5/0231 257/678 |
| 2010/0215324 A1* | 8/2010 | Ban | G02B 6/4281 385/88 |
| 2012/0320938 A1* | 12/2012 | Takenaka | G02B 6/4268 372/36 |
| 2013/0128489 A1* | 5/2013 | Satake | H05K 7/02 361/820 |
| 2014/0138148 A1* | 5/2014 | Lee | H02G 3/22 174/650 |
| 2014/0246688 A1* | 9/2014 | Dobner | H01L 33/62 257/88 |
| 2015/0155944 A1* | 6/2015 | Lee | H01S 5/02345 372/50.1 |
| 2015/0171594 A1* | 6/2015 | Serbicki | H01S 5/02212 372/38.02 |
| 2015/0279752 A1 | 10/2015 | Yokoyama | |
| 2018/0130718 A1* | 5/2018 | Kawazu | H01L 23/10 |
| 2018/0149818 A1* | 5/2018 | Yamauchi | G02B 6/4279 |
| 2018/0352648 A1* | 12/2018 | Kitamura | H01L 23/053 |
| 2019/0097388 A1* | 3/2019 | Matsuo | H01S 5/02234 |

FOREIGN PATENT DOCUMENTS

| | | | | |
|---|---|---|---|---|
| DE | 4229462 A1 | * | 3/1993 | ......... H01S 5/02216 |
| JP | 04150084 A | * | 5/1992 | |
| JP | 10223988 A | * | 8/1998 | |
| JP | H10-223988 A | | 8/1998 | |
| JP | H11-274214 A | | 10/1999 | |
| JP | 2002164453 A | * | 6/2002 | |
| JP | 2003060104 A | * | 2/2003 | |
| JP | 2003068906 A | * | 3/2003 | |
| JP | 2003100926 A | * | 4/2003 | |
| JP | 2003100929 A | * | 4/2003 | |
| JP | 2003124367 A | * | 4/2003 | |
| JP | 2003163512 A | * | 6/2003 | |
| JP | 2004087618 A | * | 3/2004 | |
| JP | 2004146404 A | * | 5/2004 | |
| JP | 2004146406 A | * | 5/2004 | |
| JP | 2004146407 A | * | 5/2004 | |
| JP | 2004281682 A | * | 10/2004 | ......... H01S 5/02216 |
| JP | 2004288668 A | * | 10/2004 | |
| JP | 2013-257362 A | | 12/2013 | |
| JP | 2017059680 A | * | 3/2017 | |
| JP | 2018-022720 A | | 2/2018 | |
| JP | 2018-085489 A | | 5/2018 | |
| NL | 193153 C | * | 12/1998 | |
| WO | WO-9103413 A1 | | 3/1991 | |
| WO | WO-2020240738 A1 | * | 12/2020 | ............ G01J 1/0403 |

* cited by examiner

LASER MODULE AND METHOD OF MANUFACTURING THE SAME

CROSS-REFERENCE TO RELATED APPLICATIONS

This is a national phase application of International Patent Application No. PCT/JP2020/011339 filed Mar. 16, 2020, which claims priority to Japanese Patent Application No. 2019-076597, filed on Apr. 12, 2019. The full contents of these applications are incorporated herein by reference.

TECHNICAL FIELD

The present invention relates to a laser module and a method of manufacturing the same, and more particularly to a laser module having a laser device capable of emitting a laser beam.

BACKGROUND

In such a laser module, a conductive wire is used to connect between a lead terminal connected to an external power source and a laser device so that the laser device is supplied with electric power from an outside of the laser device via the lead terminal (see, e.g., Patent Literature 1). Such a lead terminal is provided so as to extend through a side wall of the laser module. Therefore, a seal member is required to seal between the lead terminal and the side wall.

Furthermore, the conductive wire and the lead terminal are often connected to each other by a wire bonding process using ultrasonic waves. In the wire bonding process using ultrasonic waves, ultrasonic vibration generated by an ultrasonic generator is transmitted to a tip of a tool of a wire bonding apparatus. A conductive wire is connected to a connecting portion of a lead terminal by a load with which the tip of the tool presses the conductive wire against the connecting portion of the lead terminal and friction and hence heat due to the ultrasonic vibration. If the lead terminal is vibrated by application of the ultrasonic vibration, then the conductive wire may improperly be connected to the connecting portion of the lead terminal to cause defective connection.

Furthermore, in a conventional laser module, a seal member for sealing between a side wall of a housing and a lead terminal is provided separately from a support member for supporting a connecting portion of the lead terminal. Therefore, the manufacturing cost of the laser module increases, and an assembly operation of the laser module becomes complicated. It also becomes difficult to connect the conductive wire accurately to a desired location due to accumulation of tolerances of a plurality of components.

PATENT LITERATURE

Patent Literature 1: JP 2018-022720 A

SUMMARY

One or more embodiments of the present invention provide an inexpensive laser module that can be assembled with ease.

One or more embodiments of the present invention provide a method of manufacturing a laser module that is unlikely to cause defective connection due to a wire bonding process and allows a laser module to be assembled with ease.

According to one or more embodiments of the present invention, there is provided an inexpensive laser module that can be assembled with ease. The laser module has an optical fiber, a laser device operable to emit a laser beam, an optical system that couples the laser beam emitted from the laser device to the optical fiber, a housing including a base plate on which the laser device is fixed and a side wall in which an opening is formed, a lead terminal extending from an outside of the housing through the opening of the side wall into the housing, a conductive wire electrically connecting a connecting portion of the lead terminal located within the housing and the laser device to each other, and an insulation member including a seal portion that seals between the side wall and the lead terminal at the opening of the side wall and an extension portion extending from the seal portion into the housing while contacting the lead terminal. The extension portion of the insulation member includes a support portion that is in contact with the connecting portion of the lead terminal and supports the connecting portion.

According to one or more embodiments of the present invention, there is provided a method of manufacturing a laser module that is unlikely to cause defective connection due to a wire bonding process and allows a laser module to be assembled with ease. With this method, a laser module having a housing including a side wall with an opening formed therein and a laser device fixed to the housing is manufactured. With this method, an insulation member including a seal portion that seals between the side wall and a lead terminal at the opening of the side wall and an extension portion extending from the seal portion is formed integrally with the lead terminal so that the extension portion extends to below a connecting portion of the lead terminal to which a conductive wire is to be connected in a state in which the extension portion contacts the lead terminal. An end of the conductive wire is connected to the laser device fixed to the housing, and another end of the conductive wire is connected to the connecting portion of the lead terminal that is located within the housing by ultrasonic bonding.

DETAILED DESCRIPTION

Figure 1:
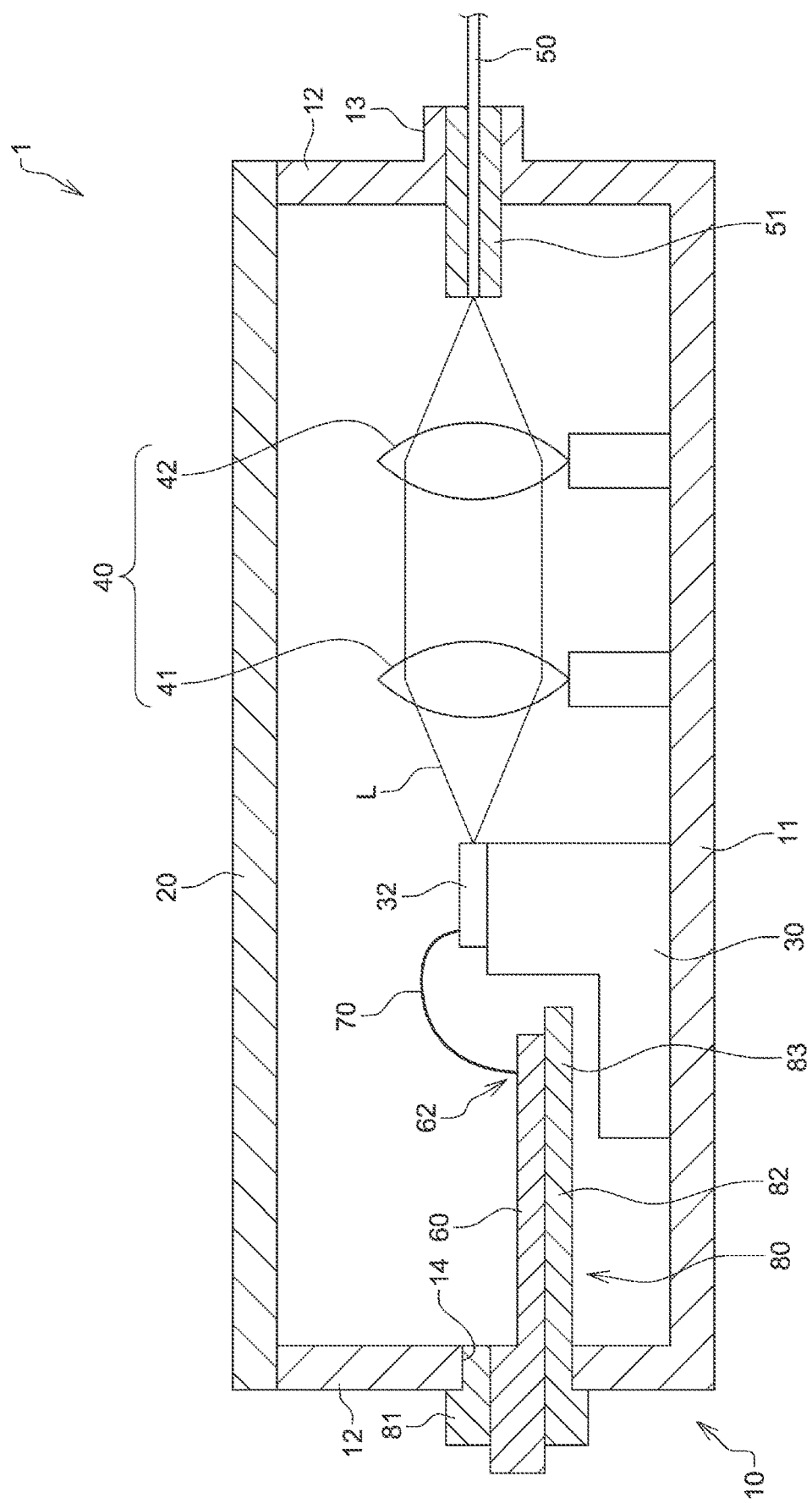
FIG. 1 is a partially cross-sectional view schematically showing a laser module according to a first embodiment of the present invention.

Embodiments of a laser module according to the present invention will be described in detail below with reference to FIGS. 1 to 5. In FIGS. 1 to 5, the same or corresponding components are denoted by the same or corresponding reference numerals and will not be described below repetitively. Furthermore, in FIGS. 1 to 5, the scales or dimensions of components may be exaggerated, or some components may be omitted.

FIG. 1 is a partial cross-sectional view schematically showing a laser module 1 according to a first embodiment of the present invention. As illustrated in FIG. 1, the laser module 1 of the present embodiment has a housing 10 including a base plate 11 and a side wall 12, a cover member 20 that covers an upper end of the housing 10, a submount 30 fixed on the base plate 11, a semiconductor laser device 32 mounted on the submount 30, a first lens 41 and a second lens 42 fixed on the base plate 11, an optical fiber 50 having an end held by a ferrule 51, and a lead terminal 60 connected to an external power source (not shown), which is provided external to the housing 10. The ferrule 51 is supported by a flange 13 provided on the side wall 12. The ferrule 51 extends through the side wall 12 into the housing 10.

An opening 14 is formed in the side wall 12. The lead terminal 60 is introduced into the housing 10 through the opening 14. The lead terminal 60 is formed of a conductive material such as copper or aluminum. The lead terminal 60 has a connecting portion 62 located within the housing 10, where an end of a conductive wire 70 is connected. Another end of the conductive wire 70 is connected to the semiconductor laser device 32 on the submount 30. The conductive wire 70 is formed of a conductive material such as gold, copper, or aluminum and connected to the connecting portion 62 of the lead terminal 60 by an ultrasonic wire bonding process. Thus, the semiconductor laser device 32 is supplied with an electric current from the external power source via the lead terminal 60 and the conductive wire 70.

When an electric current is supplied to the semiconductor laser device 32 via the lead terminal 60 and the conductive wire 70, a laser beam L is emitted from the semiconductor laser device 32. The laser beam L is focused on an end face of the optical fiber 50 by the first lens 41 and the second lens 42. The laser beam L then propagates through the optical fiber 50 so that it is outputted to an exterior of the laser module 1. In this manner, according to the present embodiment, the first lens 41 and the second lens 42 form an optical system 40 that optically couples the laser beam L emitted from the semiconductor laser device 32 to the optical fiber 50.

Since the housing 10 is formed of a metal such as copper, an insulation member 80 is provided at the opening 14 of the side wall 12 for electrically insulating the side wall 12 and the lead terminal 60 from each other. The insulation member 80 is formed of a material having an electric insulation property, such as polyether ether ketone (PEEK) resin, glass, and ceramics. The lead terminal 60 and the insulation member 80 are fixed to each other. A method of fixing those lead terminal 60 and the insulation member 80 is not limited to a specific one. For example, the lead terminal 60 and the insulation member 80 may be integrated with each other by using various methods including boding with an adhesive, threading a screw, and insert molding.

As shown in FIG. 1, the insulation member 80 includes a seal portion 81 for sealing between the side wall 12 and the lead terminal 60 at the opening 14 of the side wall 12 and an extension portion 82 extending from the seal portion 81 into the housing 10. In the present embodiment, the extension portion 82 of the insulation member 80 is formed integrally with the seal portion 81. The extension portion 82 of the insulation member 80 extends along the lead terminal 60 so as to be in contact with a lower surface of the lead terminal 60. Furthermore, the extension portion 82 of the insulation member 80 has a support portion 83 held in contact with a lower surface of the connecting portion 62 of the lead terminal 60. The connecting portion 62 of the lead terminal 60 is supported by the support portion 83. At least a portion of the support portion 83 overlaps with the connecting portion 62 of the lead terminal 60 as viewed in a plan view.

In the present embodiment, as described above, the seal portion 81 of the insulation member 80 seals between the side wall 12 of the housing 10 and the lead terminal 60, and the support portion 83, which is provided in the extension portion 82 extending from the seal portion 81 into the housing 10, supports the connecting portion 62 of the lead terminal 60. Thus, in the present embodiment, both of sealing between the side wall 12 of the housing 10 and the lead terminal 60 and support for the connecting portion 62 of the lead terminal 60 are implemented by the single insulation member 80. In this manner, the number of components required to supply electric power to the semiconductor laser device 32 can be reduced. Therefore, the cost for manufacturing the laser module 1 can be reduced. An assembly operation of the laser module 1 is also facilitated by reduction of the number of components. Furthermore, since the insulation member 80 is formed by a single component, no tolerances are accumulated. Thus, the conductive wire 70 can readily be connected to a desired location. Since the insulation member 80 of the present embodiment extends from the seal portion 81 to the support portion 83 in a continuous manner, vibration of the lead terminal 60 is suppressed so that defective connection is inhibited from being caused by a wire bonding process.

In order to manufacture the laser module 1 thus constructed, there are prepared a lead terminal 60 and an insulation member 80 that are formed integrally with each other by boding with an adhesive, threading a screw, insert molding, or the like. In this integrated state, the extension portion 82 of the insulation member 80 extends to below the connecting portion 62 of the lead terminal 60 while it is in contact with the lead terminal 60. In this state, the seal portion 81 of the insulation member 80 is fitted into the opening 14 in the side wall 12 of the housing 10 to seal between the side wall 12 of the housing 10 and the lead terminal 60. Then an end of the conductive wire 70 is connected to the semiconductor laser device 32 fixed on the base plate 11 of the housing 10, for example, by ultrasonic bonding, and another end of the conductive wire 70 is similarly connected to the connecting portion 62 of the lead terminal 60 by ultrasonic bonding. According to this method, an assembly operation of the laser module 1 is facilitated because the conductive wire 70 can be connected to the connecting portion 62 of the lead terminal 60 in a state in which the insulation member 80 and the lead terminal 60 are integrated with each other. Since the extension portion 82 of the insulation member 80 extends from the seal portion 81 to below the connecting portion 62 of the lead terminal 60 in a continuous manner, vibration of the lead terminal 60 is suppressed at the time of ultrasonic bonding so that defective connection is prevented from being caused by a wire bonding process.

Figure 2:
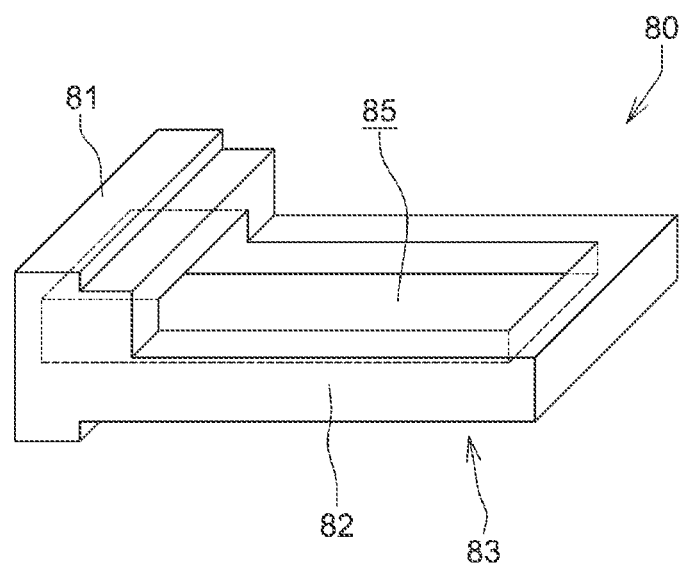
FIG. 2 is a perspective view schematically showing an example of an insulation member in the laser module illustrated in FIG. 1.

As shown in FIG. 2, it is preferable to form, in the extension portion 82 of the insulation member 80, a reception groove 85 that receives at least a portion of the lead terminal 60. When the lead terminal 60 is received in the reception groove 85 of the insulation member 80, the lead terminal 60 extending from the side wall 12 into the housing 10 is held by the extension portion 82 of the insulation member 80. Therefore, vibration of the lead terminal 60 can more effectively be suppressed at the time of ultrasonic bonding. Such a reception groove 85 may be formed so as to receive at least a portion of the lead terminal 60 extending from the side wall 12 into the housing 10. In order to more effectively suppress vibration of the lead terminal 60, it is preferable to form the reception groove 85 so as to receive the entire length of the lead terminal 60 extending from the side wall 12 into the housing 10.

Figure 3:
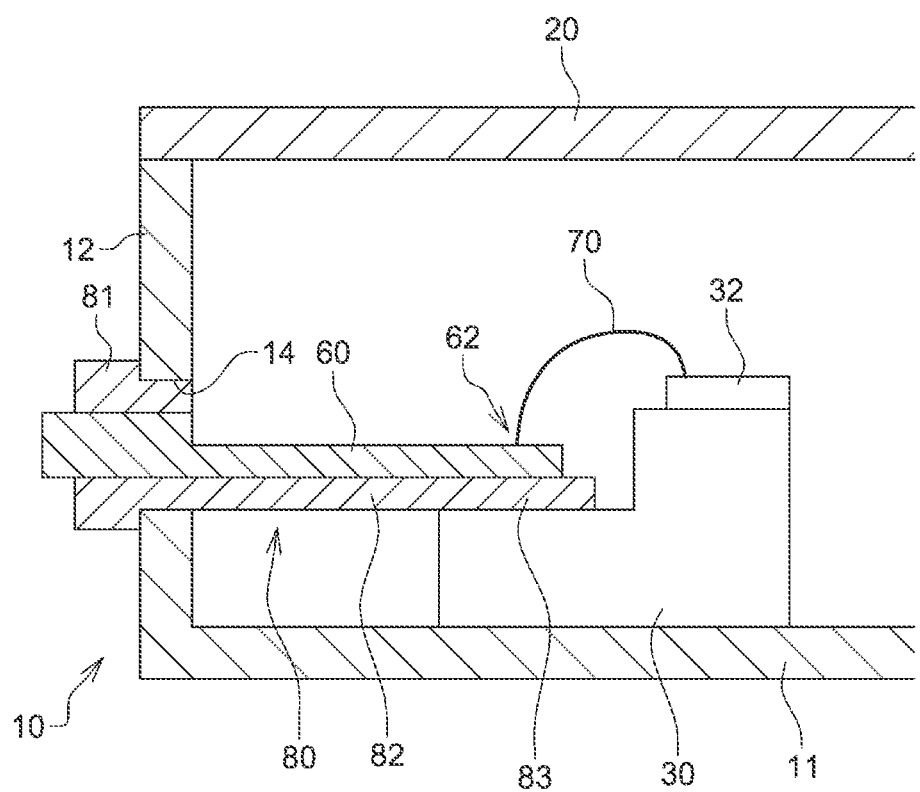
FIG. 3 is a partially cross-sectional view schematically showing a portion of a laser module according to a second embodiment of the present invention.

FIG. 3 is a partially cross-sectional view schematically showing a portion of a laser module according to a second embodiment of the present invention. In the aforementioned first embodiment, a gap is formed between the extension portion 82 of the insulation member 80 and the submount 30. In the present embodiment, however, the extension portion 82 of the insulation member 80, particularly the support portion 83, is held in contact with the submount 30.

In the present embodiment, since both of sealing between the side wall 12 of the housing 10 and the lead terminal 60 and support for the connecting portion 62 of the lead terminal 60 are implemented by the single insulation member 80, the number of components required to supply electric power to the semiconductor laser device 32 can be reduced. Thus, the cost for manufacturing the laser module can be reduced. An assembly operation of the laser module is also facilitated by reduction of the number of components. Furthermore, since the insulation member 80 is formed by a single component, no tolerances are accumulated. Thus, the conductive wire 70 can readily be connected to a desired location. Since the insulation member 80 of the present embodiment extends from the seal portion 81 to the support portion 83 in a continuous manner, vibration of the lead terminal 60 is suppressed so that defective connection is inhibited from being caused by a wire bonding process.

Particularly, in the present embodiment, the extension portion 82 of the insulation member 80, particularly the support portion 83, is held in contact with the submount 30. Therefore, the connecting portion 62 of the lead terminal 60 can be supported more firmly by the submount 30 in addition to the support portion 83 of the insulation member 80. The extension portion 82 of the insulation member 80 may be held in direct contact with the base plate 11, not with the submount 30.

Figure 4:
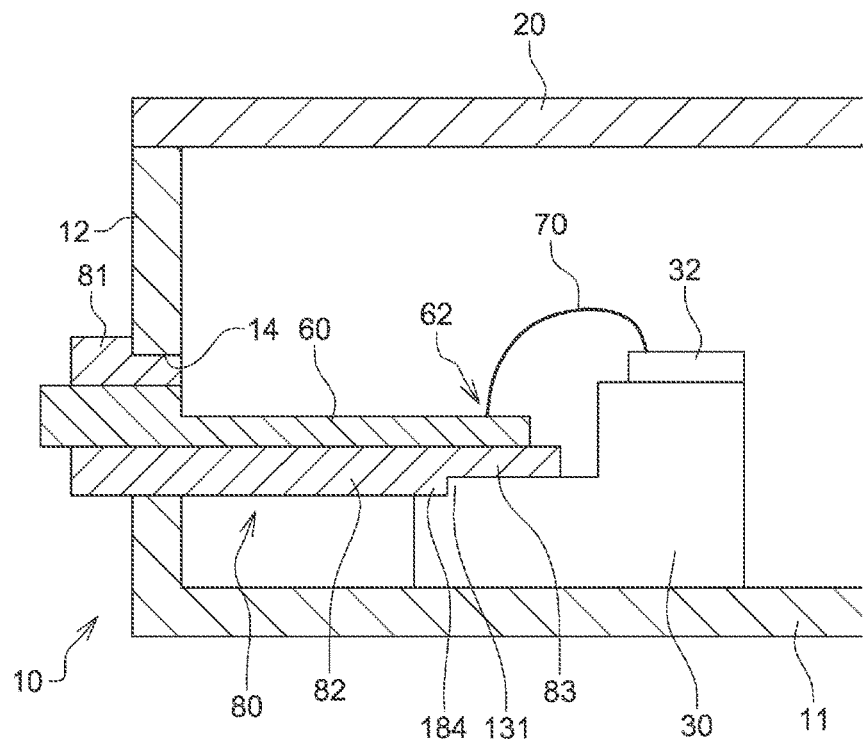
FIG. 4 is a partially cross-sectional view schematically showing a portion of a laser module according to a third embodiment of the present invention.

FIG. 4 is a partially cross-sectional view schematically showing a portion of a laser module according to a third embodiment of the present invention. The insulation member 80 of the present embodiment has an engagement portion 184 that engages with a step portion 131 formed on the submount 30. In the present embodiment, the following advantageous effects can be attained in addition to the aforementioned advantageous effects of the second embodiment.

Specifically, the engagement portion 184 of the insulation member 80 of the present embodiment engages with the step portion 131 of the submount 30 in a longitudinal direction of the lead terminal 60. Such an engagement portion 184 inhibits the insulation member 80 from moving in the longitudinal direction of the lead terminal 60 with respect to the submount 30. Therefore, vibration of the lead terminal 60 is suppressed along the longitudinal direction. As a result, defective connection is more effectively prevented from being caused by a wire bonding process.

In the present embodiment, the engagement portion 184 of the insulation member 80 engages with the step portion 131 of the submount 30. The engagement portion 184 of the insulation member 80 may be configured to engage with a projection, a groove, or a recess formed in the submount 30. The engagement portion 184 of the insulation member 80 may not engage with the step portion 131 of the submount 30 but may engage with a step portion, a projection, a groove, or a recess formed in the base plate 11.

Figure 5:
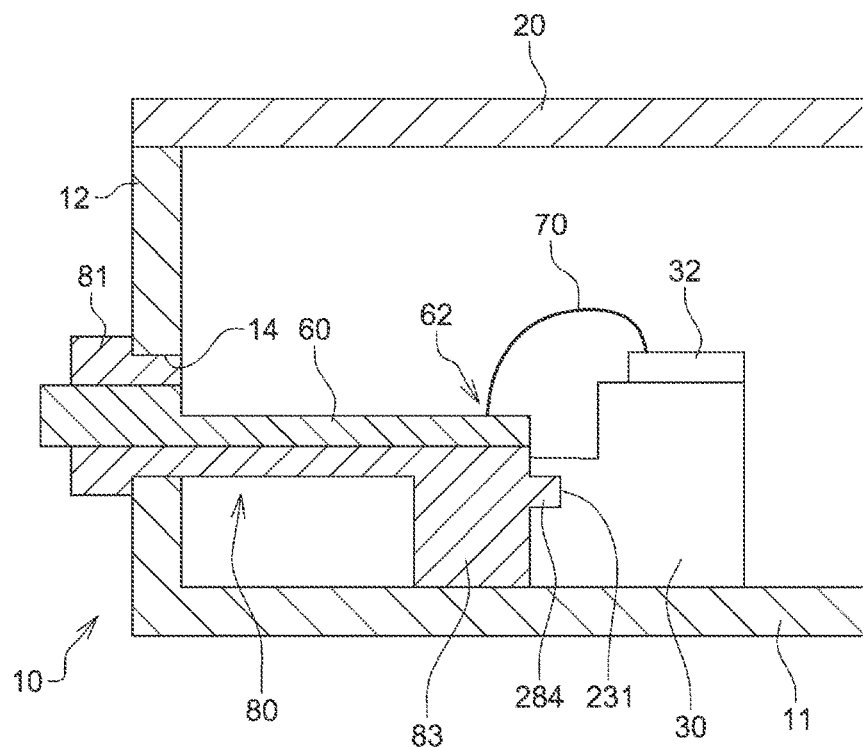
FIG. 5 is a partially cross-sectional view schematically showing a portion of a laser module according to a fourth embodiment of the present invention.

FIG. 5 is a partially cross-sectional view schematically showing a portion of a laser module according to a fourth embodiment of the present invention. The insulation member 80 of the present embodiment has an engagement portion 284 that engages with a recess 231 formed in the submount 30. In the present embodiment, the following advantageous effects can be attained in addition to the aforementioned advantageous effects of the second embodiment. The engagement portion 284 of the insulation member 80 of the present embodiment inhibits vibration of the lead terminal 60 in a vertical direction. Therefore, defective connection is more effectively prevented from being caused by a wire bonding process.

In the aforementioned embodiments, the laser module includes the single semiconductor laser device 32. As a matter of course, however, the present invention is applicable to a multichip laser module including a plurality of semiconductor laser devices.

Although some preferred embodiments of the present invention have been described, the present invention is not limited to the aforementioned embodiments. It should be understood that various different forms may be applied to the present invention within the technical idea thereof.

As described above, according to one or more embodiments of the present invention, there is provided an inexpensive laser module that can be assembled with ease. The laser module has an optical fiber, a laser device operable to emit a laser beam, an optical system that couples the laser beam emitted from the laser device to the optical fiber, a housing including a base plate on which the laser device is fixed and a side wall in which an opening is formed, a lead terminal extending from an outside of the housing through the opening of the side wall into the housing, a conductive wire electrically connecting a connecting portion of the lead terminal located within the housing and the laser device to each other, and an insulation member including a seal portion that seals between the side wall and the lead terminal at the opening of the side wall and an extension portion extending from the seal portion into the housing while contacting the lead terminal. The extension portion of the insulation member includes a support portion that is in contact with the connecting portion of the lead terminal and supports the connecting portion. At least a portion of the support portion of the insulation member may preferably overlap with the connecting portion of the lead terminal as viewed in a plan view.

According to this configuration, the seal portion of the insulation member seals between the side wall of the housing and the lead terminal, and the support portion, which is provided in the extension portion extending from the seal portion into the housing, supports the connecting portion of the lead terminal. Both of sealing between the side wall of the housing and the lead terminal and support for the connecting portion of the lead terminal can be implemented by the single insulation member. Thus, the number of required components can be reduced. Therefore, the cost for manufacturing the laser module can be reduced. An assembly operation of the laser module is also facilitated by reduction of the number of components. Furthermore, since the insulation member is formed by a single component, no tolerances are accumulated. Thus, the conductive wire can readily be connected to a desired location.

The extension portion of the insulation member may preferably have a reception groove formed therein that receives at least a portion of the lead terminal extending from the side wall into the housing. The reception groove of the insulation member may preferably be configured to receive therein an entire length of the lead terminal extending from the side wall into the housing. When the lead terminal is received in the reception groove of the insulation member, the lead terminal extending from the side wall into the housing is held by the extension portion of the insulation member. Therefore, vibration of the lead terminal can more effectively be suppressed at the time of ultrasonic bonding.

The support portion of the insulation member may be in contact with the base plate of the housing or a submount fixed on the base plate. In this case, the connecting portion of the lead terminal can be supported more firmly by the base plate or the submount in addition to the support portion of the insulation member 80.

The extension portion of the insulation member may have an engagement portion that engages with the base plate of the housing or a submount fixed on the base plate. In this case, the engagement portion of the insulation member may preferably engage with the base plate of the housing so as to inhibit the lead terminal from moving toward the base plate of the housing or away from the base plate of the housing. Such a configuration inhibits the insulation member from moving with respect to the base plate or the submount. As a result of the inhibited movement of the lead terminal, defective connection is prevented from being caused by a wire bonding process.

According to one or more embodiments of the present invention, there is provided a method of manufacturing a laser module that is unlikely to cause defective connection due to a wire bonding process and allows a laser module to be assembled with ease. With this method, a laser module having a housing including a side wall with an opening formed therein and a laser device fixed to the housing is manufactured. With this method, an insulation member including a seal portion that seals between the side wall and a lead terminal at the opening of the side wall and an extension portion extending from the seal portion is formed integrally with the lead terminal so that the extension portion extends to below a connecting portion of the lead terminal to which a conductive wire is to be connected in a state in which the extension portion contacts the lead terminal. An end of the conductive wire is connected to the laser device fixed to the housing, and another end of the conductive wire is connected to the connecting portion of the lead terminal that is located within the housing by ultrasonic bonding.

With this method, an assembly operation of the laser module is facilitated because the conductive wire can be connected to the connecting portion of the lead terminal in a state in which the insulation member and the lead terminal are integrated with each other. Furthermore, the extension portion of the insulation member extends to below the connecting portion of the lead terminal in a continuous manner, vibration of the lead terminal is suppressed at the time of ultrasonic bonding so that defective connection is prevented from being caused by a wire bonding process.

According to one or more embodiments of the present invention, the seal portion of the insulation member seals between the side wall of the housing and the lead terminal, and the support portion, which is provided in the extension portion extending from the seal portion into the housing, supports the connecting portion of the lead terminal. Both of sealing between the side wall of the housing and the lead terminal and support for the connecting portion of the lead terminal can be implemented by the single insulation member. Thus, the number of required components can be reduced. Therefore, the cost for manufacturing the laser module can be reduced. An assembly operation of the laser module is also facilitated by reduction of the number of components.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE NUMERALS AND SIGNS

1 Laser module
10 Housing
11 Base plate
12 Side wall
13 Flange
14 Opening
20 Cover member
30 Submount
32 Semiconductor laser device
40 Optical system
41 First lens
42 Second lens
50 Optical fiber
51 Ferrule
60 Lead terminal
62 Connecting portion
70 Conductive wire
80 Insulation member
81 Seal portion
82 Extension portion
83 Support portion
85 Reception groove
131 Step portion
184 Engagement portion
231 Recess
284 Engagement portion
L Laser beam

The invention claimed is:

1. A laser module comprising:
an optical fiber;
a laser device that emits a laser beam;
an optical system that couples the laser beam to the optical fiber;
a housing comprising a base plate on which the laser device is fixed and a side wall having an opening;
a lead terminal extending from an outside of the housing through the opening of the side wall into the housing;
a conductive wire electrically connecting a connecting portion of the lead terminal to the laser device, wherein the connection portion is disposed inside the housing; and
an insulation member comprising:
a seal portion that seals between the side wall and the lead terminal at the opening of the side wall; and
an extension portion that extends continuously from the seal portion into the housing to directly contact and support the lead terminal relative to the housing,
wherein the insulation member comprises a support portion at an end of the extension portion that is in direct contact with the connecting portion of the lead terminal and directly supports the connecting portion relative to the housing.

2. The laser module as recited in claim 1, wherein at least a portion of the support portion of the extension portion overlaps with the connecting portion of the lead terminal as viewed in a plan view.

3. The laser module as recited in claim 1, wherein the extension portion of the insulation member comprises a reception groove that receives at least a portion of the lead terminal extending from the side wall into the housing.

4. The laser module as recited in claim 3, wherein the reception groove of the extension portion receives an entire length of the lead terminal extending from the side wall into the housing.

5. The laser module as recited in claim 1, wherein the support portion of extension portion contacts the base plate of the housing or a submount fixed on the base plate.

6. The laser module as recited in claim 1, wherein the extension portion of the insulation member comprises an engagement portion that engages with the base plate of the housing or a submount fixed on the base plate.

7. The laser module as recited in claim 6, wherein the engagement portion of the extension portion engages with the base plate of the housing and suppresses vibration of the lead terminal.

8. A method of manufacturing a laser module, the method comprising:
- preparing an optical fiber;
- preparing a laser device operable to emit a laser beam;
- preparing an optical system that couples the laser beam emitted from the laser device to the optical fiber;
- preparing a housing including a base plate and a side wall with an opening formed therein;
- fixing a laser device to the base plate of the housing;
- forming an insulation member including
  - a seal portion configured to seal between the side wall and a lead terminal at the opening of the side wall and
  - an extension portion that extends continuously from the seal portion to directly contact and support a connecting portion of a lead terminal configured to connect to the laser device;
- sealing between the side wall and the lead terminal at the opening of the side wall with the seal portion of the insulation member while simultaneously supporting the connection portion of the lead terminal with extension portion of the insulation member;
- connecting an end of a conductive wire to the laser device fixed to the housing; and
- connecting, by ultrasonic bonding, another end of the conductive wire to the connecting portion of the lead terminal that is supported by, via direct contact, the extension portion of the insulation member within the housing.

* * * * *